(12) United States Patent
Jung et al.

(10) Patent No.: US 12,431,403 B2
(45) Date of Patent: Sep. 30, 2025

(54) SEMICONDUCTOR PACKAGE INCLUDING THERMAL INTERFACE MATERIAL (TIM) LAYERS ON SEMICONDUCTOR CHIPS

(71) Applicant: SAMSUNG ELECTRONICS CO., LTD., Gyeonggi-do (KP)

(72) Inventors: Kiwook Jung, Suwin-si (KR); Jaechoon Kim, Incheon (KR); Seunggeol Ryu, Seoul (KR); Sungeun Jo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 17/689,707

(22) Filed: Mar. 8, 2022

(65) Prior Publication Data

US 2023/0060513 A1     Mar. 2, 2023

(30) Foreign Application Priority Data

Aug. 27, 2021   (KR) .......................... 1020210114249

(51) Int. Cl.
*H01L 23/34*     (2006.01)
*H01L 23/31*     (2006.01)
*H01L 23/538*    (2006.01)

(52) U.S. Cl.
CPC .......... *H01L 23/34* (2013.01); *H01L 23/3107* (2013.01); *H01L 23/5383* (2013.01)

(58) Field of Classification Search
CPC . H01L 23/34; H01L 23/3107; H01L 23/5383; H01L 23/36; H01L 23/3735; H01L 23/49816; H01L 23/5385; H01L 23/42; H01L 23/5384; H01L 23/538
See application file for complete search history.

(56) References Cited

U.S. PATENT DOCUMENTS

| | | |
|---|---|---|
| 5,658,831 A | 8/1997 | Layton et al. |
| 8,242,602 B2 | 8/2012 | Fitzgerald et al. |
| 8,472,190 B2 | 6/2013 | Refai-Ahmed et al. |
| 9,583,415 B2 | 2/2017 | Yu et al. |
| 10,651,133 B2 | 5/2020 | Lee |
| 2007/0231967 A1* | 10/2007 | Jadhav ................ H01L 23/3735 257/E23.109 |
| 2008/0156474 A1* | 7/2008 | Simion ............... H01L 23/3675 427/446 |
| 2019/0385929 A1 | 12/2019 | Ku et al. |
| 2020/0161275 A1* | 5/2020 | Lin ..................... H01L 23/5384 |

(Continued)

FOREIGN PATENT DOCUMENTS

| | | |
|---|---|---|
| KR | 10-2013-0102052 A | 9/2013 |
| KR | 10-2019-0091752 A | 8/2019 |

*Primary Examiner* — William B Partridge
*Assistant Examiner* — Erik A. Anderson
(74) *Attorney, Agent, or Firm* — Morgan , Lewis & Bockius LLP

(57) ABSTRACT

A semiconductor package is provided. The semiconductor package includes first and second semiconductor chips mounted on an interposer structure, an insulating filler covering sides of the first and second semiconductor chips, a first thermal interface material (TIM) layer arranged on the insulating filler, and second TIM layers arranged on the first and second semiconductor chips. The thermal conductivity of each of the second TIM layers is higher than that of the first TIM layer and the first TIM layer is between the second TIM layers.

16 Claims, 14 Drawing Sheets

(56) References Cited

U.S. PATENT DOCUMENTS

| | | |
|---|---|---|
| 2020/0203254 A1 | 6/2020 | Dhane et al. |
| 2020/0219786 A1 | 7/2020 | Hung et al. |
| 2020/0227336 A1 | 7/2020 | Eid |
| 2020/0373220 A1 | 11/2020 | Chan Arguedas et al. |
| 2021/0098334 A1 | 4/2021 | Sikka et al. |
| 2021/0101175 A1* | 4/2021 | Arrington ............... C23C 28/34 |
| 2021/0134698 A1 | 5/2021 | Arrington et al. |
| 2021/0305120 A1* | 9/2021 | Mallik .................. H01L 23/562 |
| 2023/0048302 A1* | 2/2023 | Hsieh .................... H01L 23/367 |

* cited by examiner

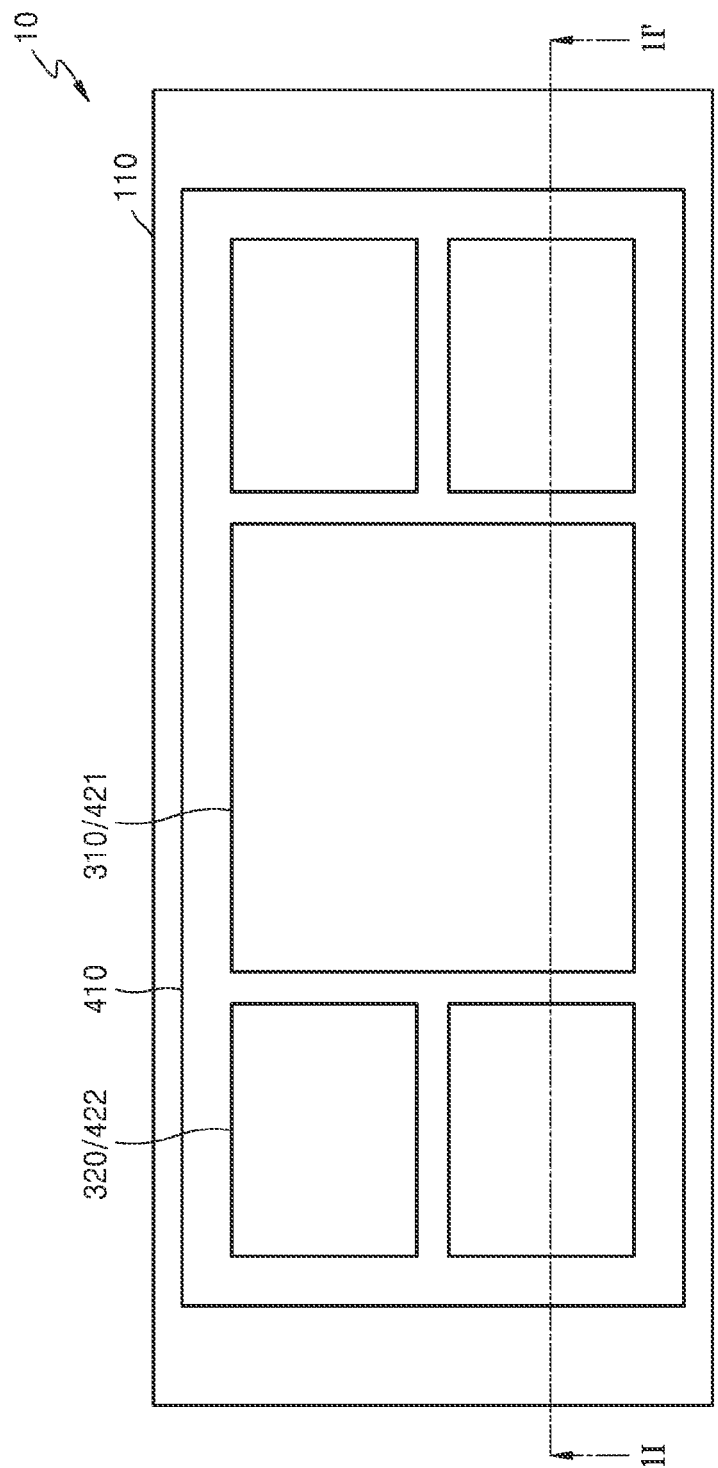

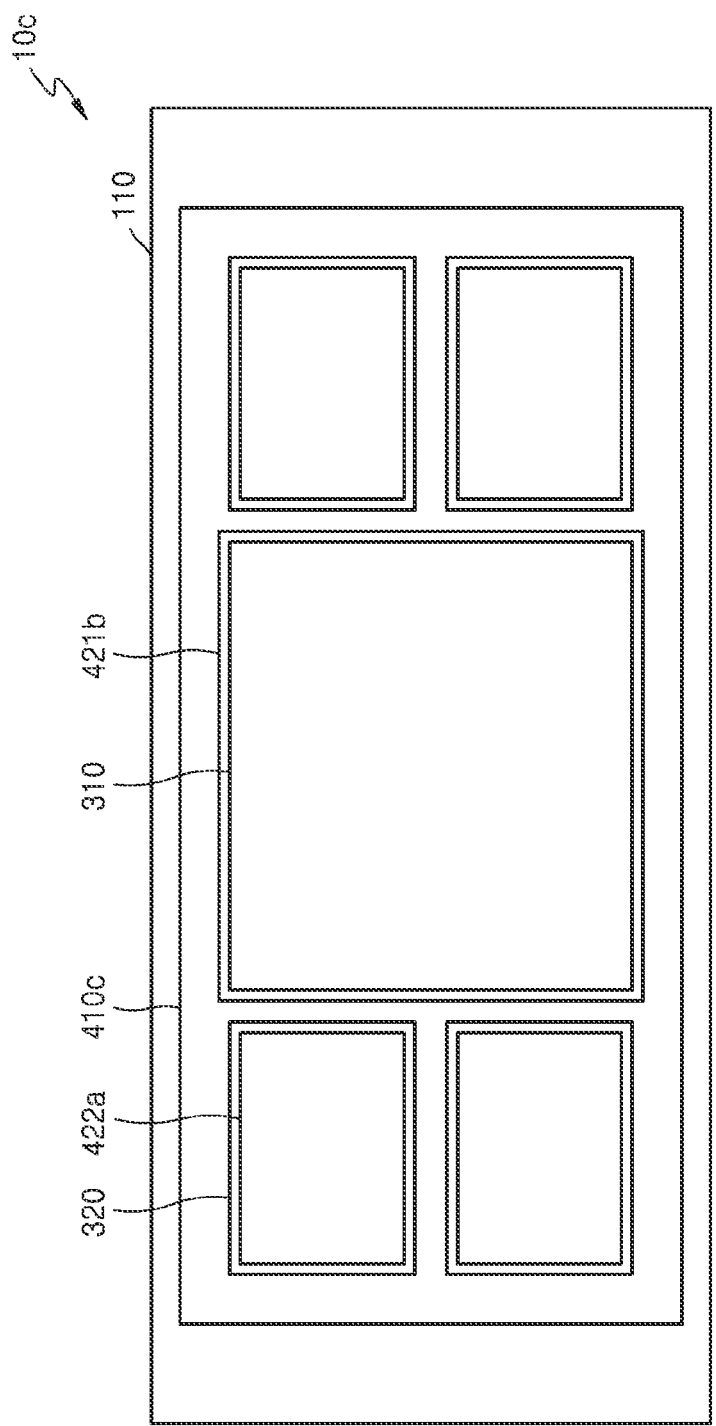

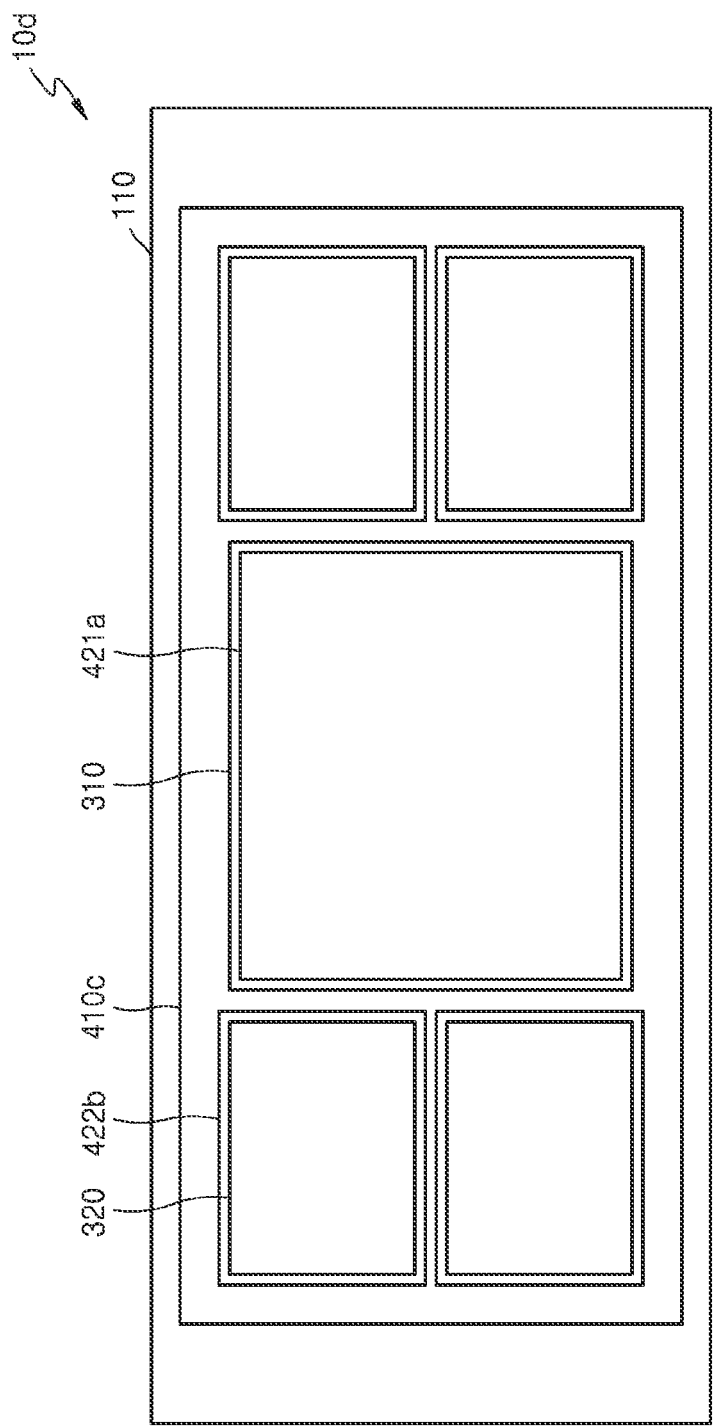

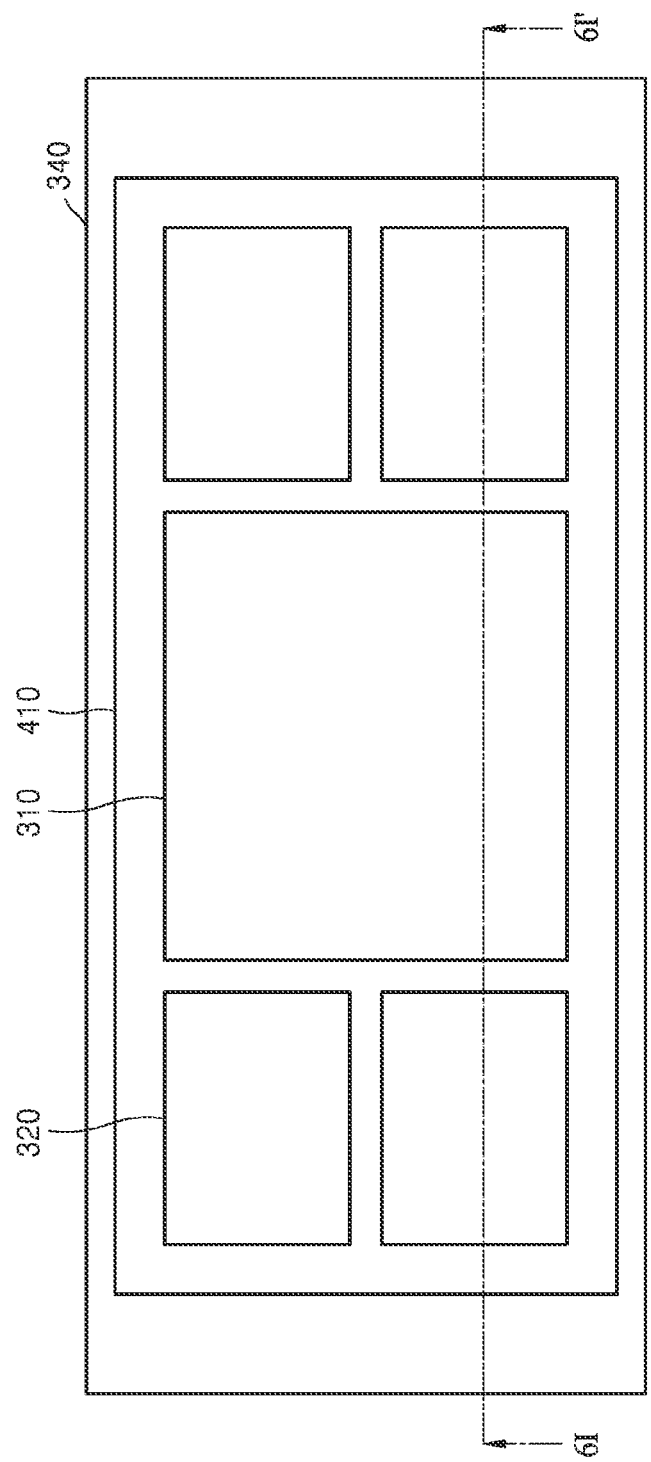

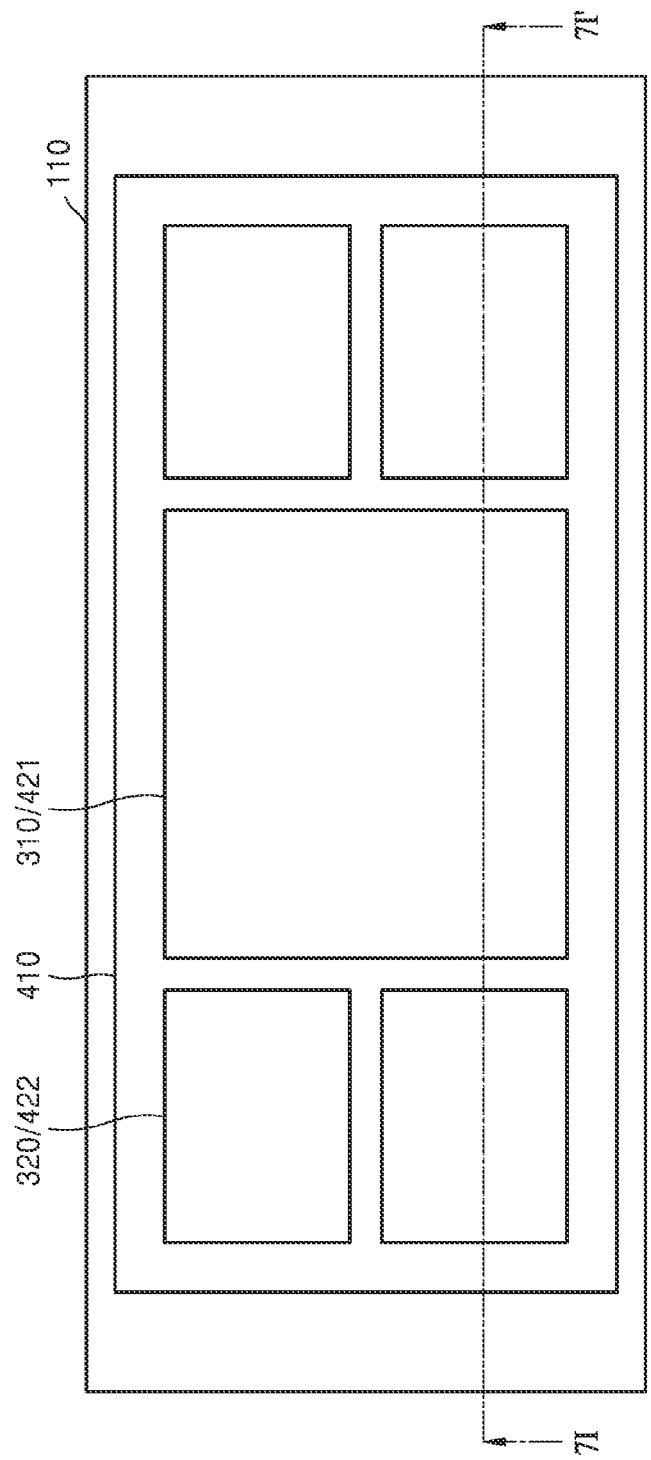

SEMICONDUCTOR PACKAGE INCLUDING THERMAL INTERFACE MATERIAL (TIM) LAYERS ON SEMICONDUCTOR CHIPS

SEMICONDUCTOR PACKAGE APPLICATION

This application is based on and claims priority under 35 U. S. C. § 119 to Korean Patent Application No. 10-2021-0114249, filed on Aug. 27, 2021, in the Korean Intellectual Property Office, the disclosure of which is incorporated by reference herein in its entirety.

BACKGROUND

The inventive concept relates to a semiconductor package, and more particularly, to a semiconductor package including a plurality of semiconductor chips.

Over the past decades, due to the development of technology, materials, and manufacturing processes, computing power and wireless communication technology have rapidly developed. Therefore, high-performance transistors may be highly integrated and a speed of integration has doubled every 18 months in accordance with Moore's law. A light, thin, short, and small system with high power efficiency are a lasting goal of semiconductor manufacturing, and at the moment when the process limit is reached, system packaging in which a system is implemented in a package is recognized as a valid solution.

System packaging technology may include, for example, integration between a logic circuit and a memory circuit, sensor packaging, or heterogeneous integration between micro electro mechanical systems (MEMS) and a complementary metal-oxide-semiconductor (CMOS) logic circuit. The system packaging technology may achieve high reliability, low power consumption, and low manufacturing cost as well as reduction in a form factor. However, recently, due to the high integration, various methods for efficiently cooling the heat generated by a semiconductor package have been suggested.

SUMMARY

The inventive concept relates to a semiconductor package with improved reliability.

In order to solve the above problem, a semiconductor package according to the inventive concept is provided. According to an aspect of the inventive concept, there is provided a semiconductor package including a package substrate, an interposer structure mounted on the package substrate, a first semiconductor chip mounted on the interposer structure, second semiconductor chips mounted on the interposer structure and adjacent to the first semiconductor chip, an insulating filler covering sides of the first and second semiconductor chips and configured to be coplanar with top surfaces of the first and second semiconductor chips, a first thermal interface material (TIM) layer arranged on the insulating filler, second TIM layers arranged on the first and second semiconductor chips, and a heat dissipation device contacting the first and second TIM layers. Thermal conductivity of each of the second TIM layers is higher than that of the first TIM layer and the first TIM layer is interposed between the second TIM layers.

According to an aspect of the inventive concept, there is provided a semiconductor package including an interposer structure mounted on a package substrate, a first semiconductor chip mounted on the interposer structure, second semiconductor chips mounted on the interposer structure and adjacent to the first semiconductor chip, an insulating filler covering sides of the first and second semiconductor chips, a first thermal interface material (TIM) layer arranged on the insulating filler and including openings at least partially exposing top surfaces of the first and second semiconductor chips, and second TIM layers filling the openings of the first TIM layer. Thermal conductivity of each of the second TIM layers range from 5 times to 25 times that of the first TIM layer and thermal conductivity of each of the second TIM layers range from 20 W/m·K to 100 W/m·K.

According to an aspect of the inventive concept, there is provided a semiconductor package including a package substrate, an interposer structure mounted on the package substrate, a first semiconductor chip mounted on the interposer structure, second semiconductor chips mounted on the interposer structure and adjacent to the first semiconductor chip, an insulating filler covering sides of the first and second semiconductor chips, a first thermal interface material (TIM) layer arranged on the insulating filler, second TIM layers arranged on the first and second semiconductor chips, and a heat dissipation device contacting the first and second TIM layers. Each of the second TIM layers includes a liquid metal and each of the second TIM layers attaches the heat dissipation device to each of the first and second semiconductor chips.

BRIEF DESCRIPTION OF THE DRAWINGS

Exemplary embodiments of the inventive concept will be more clearly understood from the following detailed description taken in conjunction with the accompanying drawings in which:

FIG. 1A is a plan view illustrating a semiconductor package according to an exemplary embodiment of the inventive concept;

FIGS. 3A to 3D are plan views illustrating semiconductor packages according to other exemplary embodiments;

FIGS. 5A to 7B are views illustrating methods of manufacturing semiconductor packages according to exemplary embodiments.

DETAILED DESCRIPTION OF THE PREFERRED EMBODIMENTS

Figure 1B:
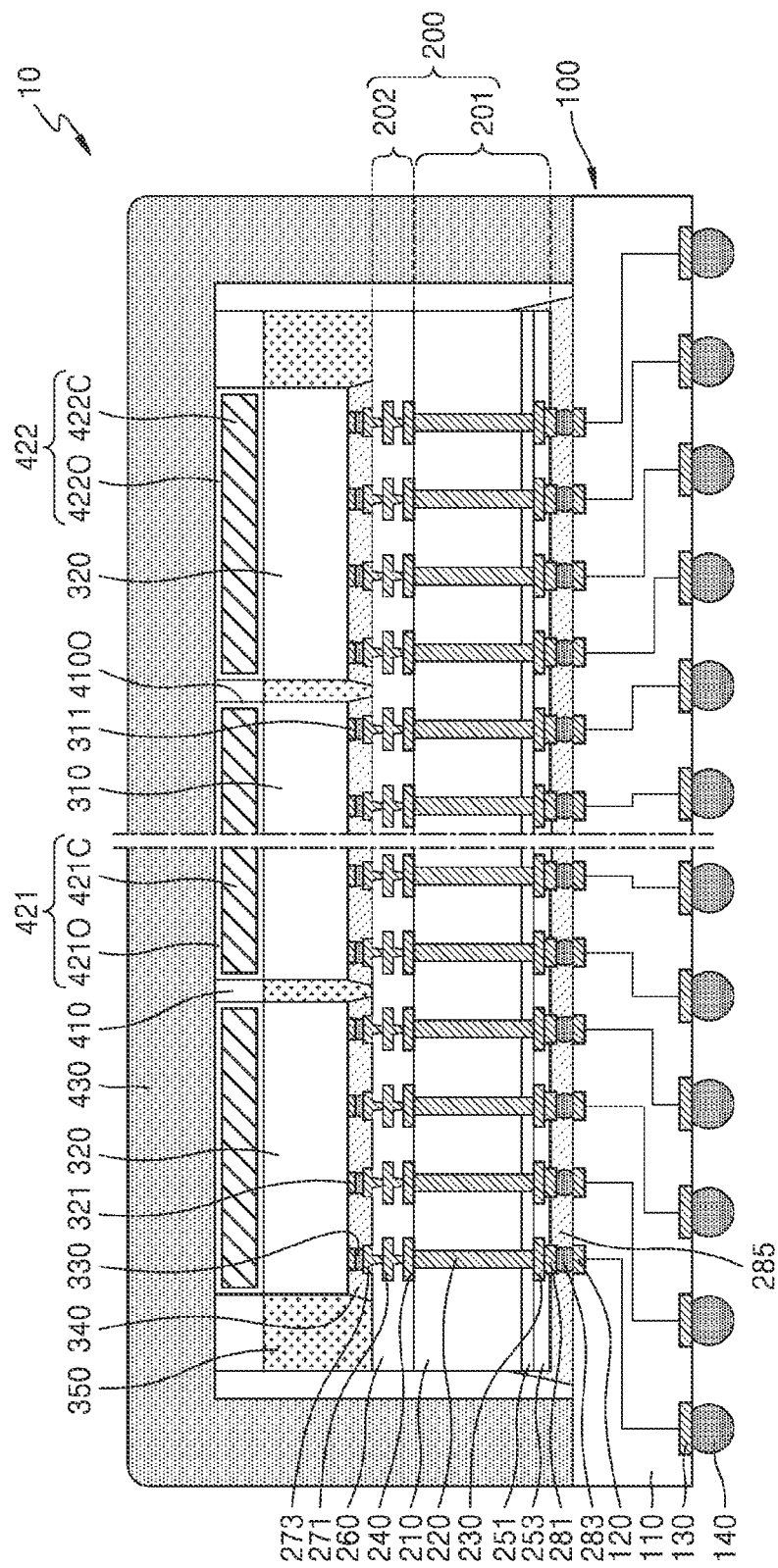
FIG. 1B is a cross-sectional view taken along the line 1I-1I' of FIG. 1A.

Hereinafter, exemplary embodiments of the inventive concept will be described in detail with reference to the accompanying drawings. Like reference numerals refer to like elements throughout and description thereof will not be unnecessarily repeated.

FIG. 1A is a plan view illustrating a semiconductor package 10 according to an exemplary embodiment of the inventive concept.

FIG. 1B is a cross-sectional view taken along the line 1I-1I' of FIG. 1A.

Referring to FIGS. 1A and 1B, the semiconductor package 10 may include a package substrate 100, an interposer structure 200, a first semiconductor chip 310, second semiconductor chips 320, a first thermal interface material (TIM) layer 410, second TIM layers 421 and 422, and a heat dissipation device 430.

The package substrate 100 may include a substrate base 110 and upper pads 120 and lower pads 130 respectively arranged on a top surface and a bottom surface of the substrate base 110. According to exemplary embodiments, the package substrate 100 may include a printed circuit board (PCB). For example, the package substrate 100 may include a multilayered PCB. The substrate base 110 may include one of phenol resin, epoxy resin, and polyimide. External connection terminals 140 electrically connecting an external device to the semiconductor package 10 may be respectively connected onto the lower pads 130.

Board-to-interposer connection bumps 283 may be respectively provided on the upper pads 120. A size of each of the board-to-interposer connection bumps 283 may be greater than that of each of connection bumps 330 to be described later. The package substrate 100 may be connected to the interposer structure 200 through the board-to-interposer connection bumps 283.

The interposer structure 200 may include lower connection pillars 281 arranged on lower conductive pads 230. The lower connection pillars 281 may be connected to the lower conductive pads 230 through openings on a second lower protective layer 253 and may contact a part of the second lower protective layer 253 covering edges of bottom surfaces of the lower conductive pads 230. The lower connection pillars 281 may include under bump metallurgy. The lower connection pillars 281 may include nickel (Ni), copper (Cu), palladium (Pd), platinum (Pt), gold (Au), or any combination of the above metals. As occasion demands, the lower connection pillars 281 may be omitted.

The package substrate 100 may be electrically connected to the interposer structure 200 through the board-to-interposer connection bumps 283. The semiconductor package 10 may include a first insulating filler 285 arranged between the interposer structure 200 and the package substrate 100. The first insulating filler 285 may fill a space between the interposer structure 200 and the package substrate 100 and may cover the board-to-interposer connection bumps 283. For example, the first insulating filler 285 may be formed by a capillary underfill process.

For example, the first insulating filler 285 may include a base material layer such as epoxy resin and a filler included in the base material layer. The filler of the first insulating filler 285 may include an organic filler or an inorganic filler. For example, the filler of the first insulating filler 285 may include silica.

The interposer structure 200 may include a through silicon via (TSV) layer 201 and a rewiring layer 202.

The TSV layer 201 may include a base layer 210, through electrodes 220, the lower conductive pads 230, upper conductive pads 240, a first lower protective layer 251, and the second lower protective layer 253.

The base layer 210 may include a semiconductor material, glass, ceramic, or plastic. According to exemplary embodiments, the base layer 210 may include a silicon (Si) wafer including Si, for example, crystalline Si, polycrystalline Si, or amorphous Si. The base layer 210 may have the shape of a flat plate.

The first lower protective layer 251 may cover a bottom surface of the base layer 210. In addition, the first lower protective layer 251 may cover side walls of the through electrodes 220 protruding from the bottom surface of the base layer 210. According to exemplary embodiments, a bottom surface of the first lower protective layer 251 may be coplanar with the bottom surfaces of the through electrodes 220 contacting the lower conductive pads 230.

According to exemplary embodiments, the first lower protective layer 251 may include an inorganic insulating material. For example, the first lower protective layer 251 may include at least one of silicon oxide and silicon nitride.

According to exemplary embodiments, the first lower protective layer 251 may have a multilayer structure including a plurality of insulating layers. For example, the first lower protective layer 251 may include a first layer and a second layer sequentially stacked on the bottom surface of the base layer 210. According to exemplary embodiments, the first layer of the first lower protective layer 251 may include silicon oxide with high adhesion. According to exemplary embodiments, the second layer of the first lower protective layer 251 may include silicon nitride.

The lower conductive pads 230 may be arranged on the bottom surface of the first lower protective layer 251. For example, the lower conductive pads 230 may be respectively connected to the board-to-interposer connection bumps 283. The lower conductive pads 230 may be apart from one another on the bottom surface of the first lower protective layer 251 in a horizontal direction. For example, the lower conductive pads 230 may configure an array on the bottom surface of the first lower protective layer 251. The lower conductive pads 230 may be polygonal, for example, square or hexagonal from a two dimensional point of view. Alternatively, the lower conductive pads 230 may be circular or elliptical from a two dimensional point of view. The lower conductive pads 230 may include, for example, tungsten (W), aluminum (Al), or Cu.

According to exemplary embodiments, the lower conductive pads 230 may have a constant thickness. The lower conductive pads 230 may have top surfaces contacting the first lower protective layer 251 and the through electrodes 220 and the bottom surfaces opposite to the top surfaces of the lower conductive pads 230 and the top surfaces and the bottom surfaces of the lower conductive pads 230 may be flat.

The second lower protective layer 253 may cover the bottom surface of the first lower protective layer 251 and parts of the lower conductive pads 230. The second lower protective layer 253 may include the openings exposing parts of the bottom surfaces of the lower conductive pads 230. Through the openings of the second lower protective layer 253, the board-to-interposer connection bumps 283 may be connected to the lower conductive pads 230.

According to exemplary embodiments, the second lower protective layer 253 may include a material different from that of the first lower protective layer 251. The first lower protective layer 251 may include an inorganic insulating material, and the second lower protective layer 253 may include an organic insulating material. According to exemplary embodiments, the second lower protective layer 253 may include photo imageable dielectric (PID). For example, the second lower protective layer 253 may include polyimide (PI) or polybenzoxazole (PBO). In another example, the second lower protective layer 253 may include an inorganic insulating material.

The through electrodes 220 may be configured to electrically connect the upper conductive pads 240 of the rewiring layer 202 to the lower conductive pads 230. The through electrodes 220 may extend from a top surface of the base layer 210 to the bottom surface of the base layer 210 and may pass through the base layer 210 in a vertical direction. In addition, the through electrodes 220 may further pass through the first lower protective layer 251 arranged on the bottom surface of the base layer 210. Upper ends of the through electrodes 220 may be connected to the upper conductive pads 240, and lower ends thereof may be connected to the lower conductive pads 230.

Herefore, the horizontal direction means a direction parallel with a top surface of the package substrate 100 and the vertical direction means a direction perpendicular to the top surface of the package substrate 100. Therefore, a horizontal direction length or a horizontal length of a specific element may represent a length in the direction parallel with the top surface of the package substrate 100. Likewise, a vertical direction length or a vertical length of a specific element may represent a length in the direction perpendicular to the top surface of the package substrate 100. In addition, a horizontal area of a specific element represents an area of a surface parallel with the top surface of the package substrate 100 of the specific element.

For example, the through electrodes 220 may include columnar conductive plugs passing through the base layer 210 and the first lower protective layer 251 and a cylindrical conductive barrier layer surrounding side walls of the conductive plugs. The conductive barrier layer may include titanium (Ti), titanium nitride (TiN), tantalum (Ta), tantalum nitride (TaN), ruthenium (Ru), cobalt (Co), manganese (Mn), tungsten nitride (WN), Ni, or nickel boron (NiB) and the conductive plugs may include a Cu alloy such as Cu, copper tin (CuSn), copper magnesium (CuMg), copper nickel (CuNi), copper zinc (CuZn), copper palladium (CuPd), copper gold (CuAu), copper rhenium (CuRe), or copper tungsten (CuW), W, a W alloy, Ni, Ru, or Co. A via insulating layer may be disposed between the base layer 210 and the through electrodes 220. The via insulating layer may include an oxide layer, a nitride layer, a carbide layer, polymer, or a combination of the above materials.

The rewiring layer 202 may be arranged on a top surface of the TSV layer 201. The rewiring layer 202 may include rewiring patterns 271 and 273 electrically connected to the upper conductive pads 240. The rewiring layer 202 may further include an insulating layer 260 covering the top surface of the base layer 210. The insulating layer 260 may cover the upper conductive pads 240 and the rewiring patterns 271 and 273. The rewiring layer 202 may have a back-end-of-line (BEOL) structure.

According to exemplary embodiments, the insulating layer 260 may include an inorganic insulating material. For example, the insulating layer 260 may include at least one of silicon oxide and silicon nitride. According to other exemplary embodiments, the insulating layer 260 may include an organic insulating material. For example, the insulating layer 260 may include PID.

The rewiring patterns 271 and 273 may include lines extending in the horizontal direction and vias extending in the vertical direction. The rewiring patterns 271 and 273 may include, for example, W, Al, or Cu. The rewiring patterns 273 may function as pads for electrical connection to the first and second semiconductor chips 310 and 320.

The first and second semiconductor chips 310 and 320 may be mounted on the interposer structure 200. The first and second semiconductor chips 310 and 320 may be apart from one another on the rewiring layer 202 of the interposer structure 200 in the horizontal direction. The first and second semiconductor chips 310 and 320 may be mounted on the interposer structure 200 by a flip chip method. That is, bottom surfaces of the first and second semiconductor chips 310 and 320, on which chip pads 311 and 321 are formed, may face the interposer structure 200. The chip pads 311 and 321 of the first and second semiconductor chips 310 and 320 may be configured to be electrically connected to the rewiring patterns 273 through the connection bumps 330. The chip pads 311 and 321 of the first and second semiconductor chips 310 and 320 may be used as terminals for transmitting input/output data signals or terminals for power and/or ground.

Each of the first and second semiconductor chips 310 and 320 may include a semiconductor substrate and a semiconductor device layer. The semiconductor substrate may include an active surface and an inactive surface opposite to each other. The semiconductor substrate may include Si, for example, crystalline Si, polycrystalline Si, or amorphous Si. The semiconductor device layer may be formed on the active surface of the semiconductor substrate. The first and second semiconductor chips 310 and 320 may include bottom surfaces and top surfaces opposite to each other. The bottom surfaces of the first and second semiconductor chips 310 and 320 may be adjacent to the active surface of the semiconductor substrate, and the top surfaces of the first and second semiconductor chips 310 and 320 may be adjacent to the inactive surface of the semiconductor substrate. The chip pads 311 and 321 of the first and second semiconductor chips 310 and 320 may be arranged on the bottom surfaces of the first and second semiconductor chips 310 and 320. The chip pads 311 and 321 of the first and second semiconductor chips 310 and 320 may be electrically connected to individual devices of the semiconductor device layer through wiring structures (not shown) provided in the first and second semiconductor chips 310 and 320. The first and second semiconductor chips 310 and 320 may be electrically connected to the package substrate 100 through the interposer structure 200.

For example, the first semiconductor chip 310 arranged in the horizontal center of the semiconductor package 10 may include a logic chip and the second semiconductor chips 320 arranged at an edge of the first semiconductor chip 310 may include memory chips. According to exemplary embodiments, a first horizontal area of the first semiconductor chip 310 may be greater than a second horizontal area that is a horizontal area of each of the second semiconductor chips 320. According to exemplary embodiments, intervals (that is, horizontal intervals) among the first and second semiconductor chips 310 and 320 may range from about 200 μm to about 1,000 μm. According to exemplary embodiments, the intervals among the first and second semiconductor chips 310 and 320 may be about 500 m or more.

An arrangement of the first and second semiconductor chips 310 and 320 illustrated in FIG. 1B is an example, and the inventive concept is not limited thereto. The number and arrangement of first semiconductor chip 310 having the first horizontal area and second semiconductor chips 320 each having the second horizontal area that is less than the first horizontal area may vary in accordance with a given application.

According to exemplary embodiments, each of the second semiconductor chips 320 may include a volatile memory chip and/or a non-volatile memory chip. The volatile memory chip may include, for example, dynamic random access memory (DRAM), static RAM (SRAM), thyristor RAM (TRAM), zero capacitor RAM (ZRAM), or twin transistor RAM (TTRAM). In addition, the non-volatile memory chip may include, for example, flash memory, magnetic RAM (MRAM), spin-transfer torque MRAM (STT-MRAM), FRAM (ferroelectric RAM), phase change RAM (PRAM), resistive RAM (RRAM), nanotube RRAM, polymer RAM, or insulator resistance change memory.

In another example, each of the second semiconductor chips 320 may include a stacked semiconductor memory chip. The stacked semiconductor memory chip may be implemented based on high bandwidth memory (HBM) or a hybrid memory cube (HMC) standard. The stacked semiconductor memory chip may include a buffer die and a plurality of core dies stacked on the buffer die. The buffer die may also be referred to as an interface die, a base die, a logic die, or a master die, and each of the plurality of core dies may be also referred to as a memory die or a slave die. The number of core dies may be 2, 4, 8, 12, or 16.

The buffer die may be electrically connected to the plurality of core dies by TSVs. An insulating adhesive layer may be disposed between the buffer dies, and each of the plurality of core dies and between each two of the plurality of core dies. The insulating adhesive layer may include, for example, non-conductive film (NCF), non-conductive paste (NCP), insulating polymer, or epoxy resin. Each of the second semiconductor chips 320 may further include a molding layer covering sides of the buffer die and sides of the plurality of core dies. The molding layer may include, for example, an epoxy molding compound (EMC).

Each of the plurality of core dies may include a memory cell array. The buffer die may include a physical layer and a direct access area. The physical layer of the buffer die may include interface circuits for communication with an external host device and may be electrically connected to the second semiconductor chips 320 through the interposer structure 200.

Each of the second semiconductor chips 320 may receive or transmit signals from or to the first semiconductor chip 310 through the physical layer of the buffer die. The signals and/or data received through the physical layer of the buffer die of each of the second semiconductor chips 320 may be transmitted to the plurality of core dies through the TSV's. The direct access area of the buffer die may provide an access path through which each of the second semiconductor chips 320 may be tested without passing through the first semiconductor chip 310. The direct access area may include a conductive unit (for example, a port or a pin) capable of enabling direct communication with an external test device.

The first semiconductor chip 310 may execute applications supported by the semiconductor package 10 by using the second semiconductor chips 320. For example, the first semiconductor chip 310 may execute specialized operations including at least one processor among a central processing unit (CPU), an application processor (AP), a graphics processing unit (GPU), a neural processing unit (NPU), a tensor processing unit (TPU), a vision processing unit (VPU), an image signal processor (ISP), and a digital signal processor (DSP).

The first semiconductor chip 310 may include a physical layer and a memory controller. The physical layer of the first semiconductor chip 310 may include input and output circuits for transmitting and receiving signals to and from the physical layer of each of the second semiconductor chips 320. The first semiconductor chip 310 may provide various signals to the physical layer of each of the second semiconductor chips 320 through the physical layer thereof. The memory controller of the first semiconductor chip 310 may control overall operations of the second semiconductor chips 320. The memory controller of the first semiconductor chip 310 may transmit signals for controlling the second semiconductor chips 320 to the second semiconductor chips 320 through the rewiring patterns 271 and 273 of the interposer structure 200.

The semiconductor package 10 may include a second insulating filler 340 arranged between the first and second semiconductor chips 310 and 320 and the interposer structure 200. The second insulating filler 340 may be provided by a method similar to that of the first insulating filler 285.

The semiconductor package 10 may further include a third insulating filler 350 covering the sides of the first and second semiconductor chips 310 and 320. The third insulating filler 350 may include a base material layer such as epoxy resin and a filler included in the base material layer. The filler may include either an organic filler or an inorganic filler. The filler may include, for example, silica. According to exemplary embodiments, the third insulating filler 350 may include an EMC.

The first TIM layer 410 may be arranged on the third insulating filler 350. The first TIM layer 410 may vertically overlap the third insulating filler 350. The first TIM layer 410 may contact the third insulating filler 350. According to exemplary embodiments, a horizontal area of the first TIM layer 410 may be equal to a horizontal area of the third insulating filler 350.

According to exemplary embodiments, the first TIM layer 410 may not vertically overlap the first and second semiconductor chips 310 and 320. The first TIM layer 410 may include openings 410O exposing the top surfaces of the first and second semiconductor chips 310 and 320.

According to exemplary embodiments, a thickness of the first TIM layer 410 may range from about 50 μm to about 200 μm. According to another exemplary embodiment, a thickness of the first TIM layer 410 may range from about 100 m to about 150 μm.

The first TIM layer 410 may include an insulating material. The first TIM layer 410 may include a material having low thermal conductivity. According to exemplary embodiments, the first TIM layer 410 may not include a metal material. According to exemplary embodiments, the thermal conductivity of the first TIM layer 410 may range from about 3 W/m·K to about 4 W/m·K.

The second TIM layers 421 and 422 may be arranged in the openings 410O of the first TIM layer 410. The second TIM layers 421 and 422 may be surrounded by the first TIM layer 410. Sides of the second TIM layers 421 and 422 may contact internal side surfaces defining the openings 410O of the first TIM layer 410.

Each of the second TIM layers 421 and 422 may be arranged on each of the first and second semiconductor chips 310 and 320. Each of the second TIM layers 421 and 422 may vertically overlap each of the first and second semiconductor chips 310 and 320. Each of the second TIM layers 421 and 422 may contact each of the first and second semiconductor chips 310 and 320. The second TIM layers 421 and 422 need not vertically overlap the third insulating filler 350.

Each of the second TIM layers 421 and 422 may have the same area as the horizontal area of each of the first and second semiconductor chips 310 and 320. For example, the second TIM layer 421 may have the same horizontal area as the horizontal area of the first semiconductor chip 310. For example, each of the second TIM layers 422 may have the same horizontal area as the horizontal area of each of the second semiconductor chips 320.

According to exemplary embodiments, the second TIM layers 421 and 422 may respectively include core layers 421C and 422C and oxide layers 421O and 422O respectively surrounding the core layers 421C and 422C. Each of the oxide layers 421O and 422O may cover a bottom surface, a top surface, and sides of each of the core layers 421C and 422C. Each of the oxide layers 421O and 422O may contact the bottom surface, the top surface, and the sides of each of the core layers 421C and 422C. The core layers 421C and 422C of the second TIM layers 421 and 422 may include a metal material. According to exemplary embodiments, the core layers 421C and 422C of the second TIM layers 421 and 422 may include, for example, a liquid metal such as gallium indium tin (GaInSn).

The oxide layers 421O and 422O may be obtained by oxidizing a part of the material configuring the core layers 421C and 422C. When the core layers 421C and 422C include GaInSn, the oxide layers 421O and 422O may include gallium oxide ($Ga_2O_3$). According to exemplary embodiments, each of the oxide layers 421O and 422O may have a thickness of several nms.

Each of the oxide layers 421O and 422O may include a material having high thermal conductivity. According to exemplary embodiments, the thermal conductivity of each of the second TIM layers 421 and 422 may be greater than a thermal conductivity of the first TIM layer 410. According to exemplary embodiments, the thermal conductivity of each of the second TIM layers 421 and 422 may range from about 5 times to about 25 times the thermal conductivity of the first TIM layer 410. According to exemplary embodiments, the thermal conductivity of each of the core layers 421C and 422C of each of the second TIM layers 421 and 422 may range from about 20 W/m·K to about 100 W/m·K.

The semiconductor package 10 may further include the heat dissipation device 430 covering the top surfaces of the first and second semiconductor chips 310 and 320. The heat dissipation device 430 may include a heat dissipation plate such as a heat slug or a heat sink. According to exemplary embodiments, the heat dissipation device 430 may be attached onto the top surface of the package substrate 100 and may surround side walls of the interposer structure 200 and the first and second semiconductor chips 310 and 320.

In contrast, conventional semiconductor packages include a TIM layer having thermal conductivity of about 3 W/m·K to about 4 W/m·K on the first and second semiconductor chips 310 and 320. Therefore, the first and second semiconductor chips 310 and 320 are not sufficiently cooled by the heat dissipation device 430. In particular, due to thermal coupling among the first and second semiconductor chips 310 and 320, which is caused by the TIM layer, heat generated by the first semiconductor chip 310 is transmitted to the second semiconductor chips 320 or heat generated by the second semiconductor chips 320 is transmitted to the first semiconductor chip 310.

According to exemplary embodiments, by providing the second TIM layers 421 and 422 contacting the first and second semiconductor chips 310 and 320 and each having high thermal conductivity in a range of about 20 W/m·K to about 100 W/m·K, the first and second semiconductor chips 310 and 320 may be efficiently cooled. According to experimental results, it has been confirmed that, by providing the second TIM layers 421 and 422, the cooling efficiency of the first semiconductor chip 310 increases by about 8%.

In addition, the first TIM layer 410 may function as a thermal barrier to the second TIM layers 421 and 422. The second TIM layers 421 and 422 may be arranged in the openings 410O of the first TIM layer 410, and a part of the first TIM layer 410 may be arranged between each two of the second TIM layers 421 and 422. Therefore, due to the part of the first TIM layer 410 between each two of the second TIM layers 421 and 422 and having low thermal conductivity, thermal coupling among the second TIM layers 421 and 422 may be reduced so that the thermal coupling among the first and second semiconductor chips 310 and 320 may also be reduced. According to an experimental results, it has been confirmed that, by providing the second TIM layers 421 and 422, the thermal coupling among the first and second semiconductor chips 310 and 320 is reduced by about 4%.

In addition, the first TIM layer 410 may function as a physical barrier to the second TIM layers 421 and 422. The first TIM layer 410 may limit the second TIM layers 421 and 422 in the openings 410O and may prevent an electric short in the semiconductor package 10 due to a bleeding phenomenon of the second TIM layers 421 and 422.

In addition, the first TIM layer 410 may function as an electrical barrier to the second TIM layers 421 and 422. Therefore, an electric short among the first and second semiconductor chips 310 and 320 through the second TIM layers 421 and 422 each having conductivity may be prevented.

According to an exemplary embodiment, because the cooling efficiency of the first and second semiconductor chips 310 and 320 may be increased and the thermal coupling among the first and second semiconductor chips 310 and 320 may be reduced by providing the first and second TIM layers 410, 421, and 422, the operational reliability of the semiconductor package 10 may increase.

Figure 2:
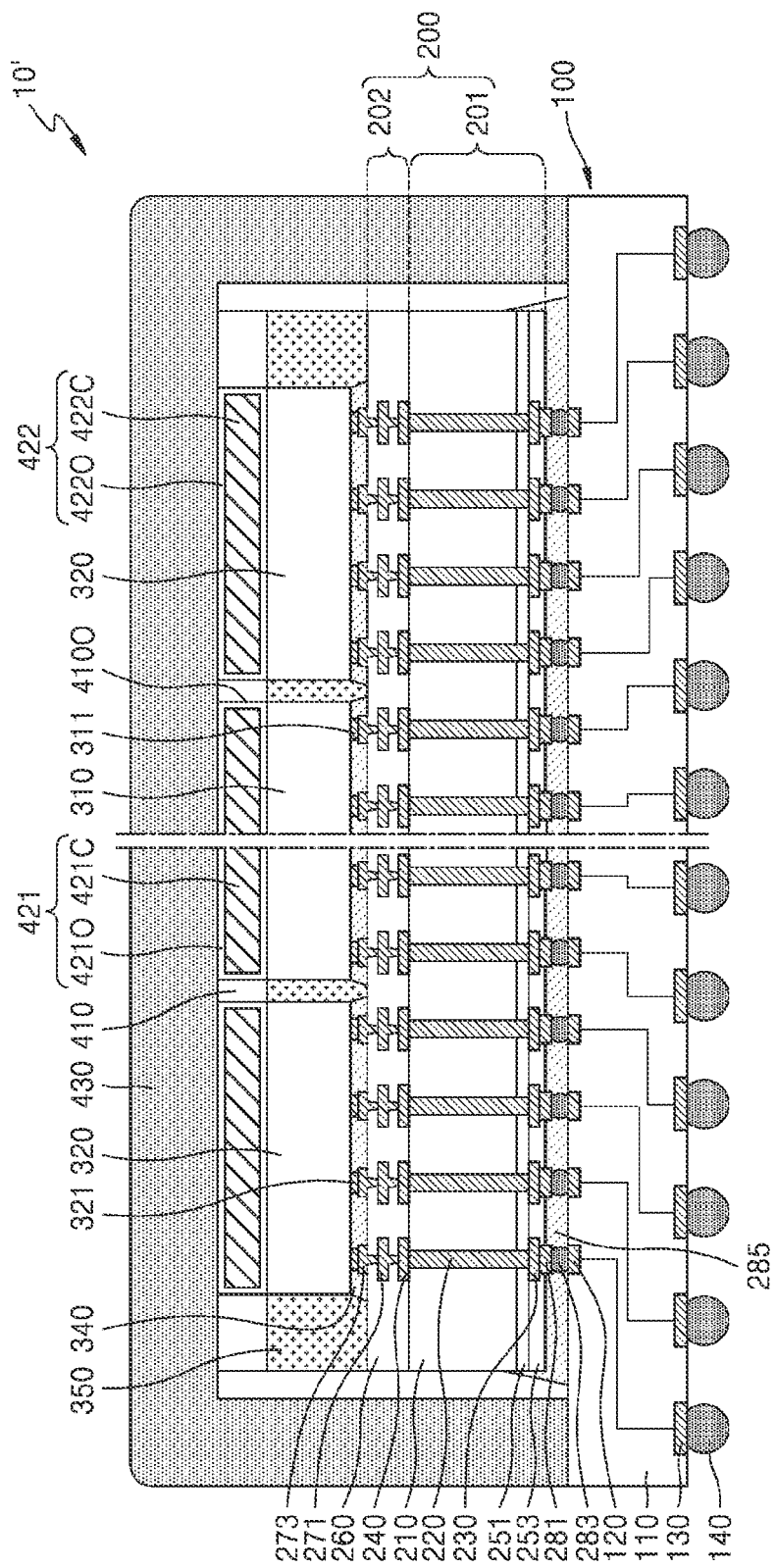
FIG. 2 is a cross-sectional view illustrating a semiconductor package according to another exemplary embodiment and illustrates a portion corresponding to FIG. 1B.

FIG. 2 is a cross-sectional view illustrating a semiconductor package 10' according to another exemplary embodiment and a portion corresponding to FIG. 1B.

The semiconductor package 10' of FIG. 2 is similar to the semiconductor package 10 described with reference to FIGS. 1A and 1B. However, the semiconductor package 10' may omit the connection bumps 330 arranged between the first and second semiconductor chips 310 and 320 and the interposer structure 200. Therefore, the chip pads 311 and 321 of the first and second semiconductor chips 310 and 320 may directly contact the rewiring patterns 273.

Figure 3A:
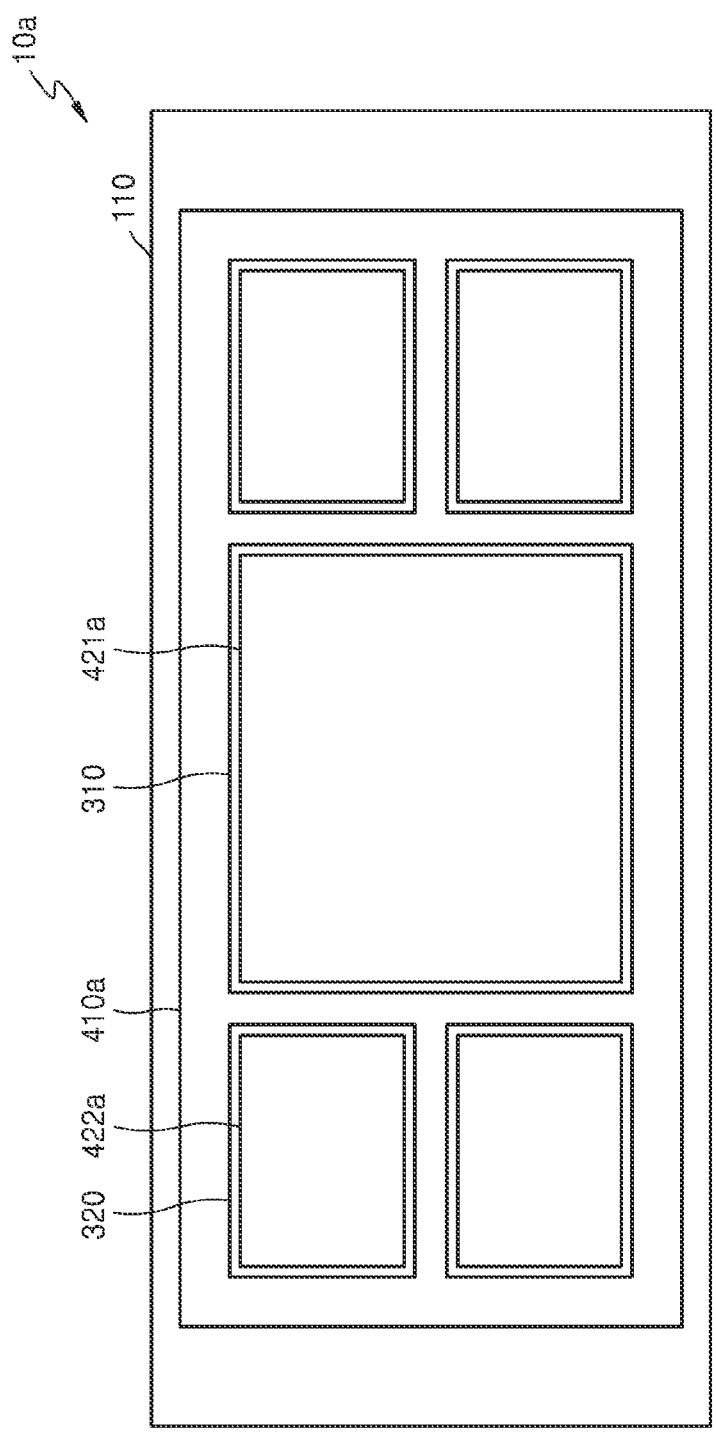

FIG. 3A is a plan view illustrating a semiconductor package 10a according to another exemplary embodiment.

Referring to FIG. 3A, the semiconductor package 10a is similar to the semiconductor package 10 described with reference to FIGS. 1A and 1B. However, a horizontal area of each of second TIM layers 421a and 422a may be different from a horizontal area of each of first and second semiconductor chips 310 and 320.

More specifically, the horizontal area of the second TIM layer 421a contacting the first semiconductor chip 310 may be less than a horizontal area of the first semiconductor chip 310 and the horizontal area of each of the second TIM layers 422a contacting each of the second semiconductor chips 320 may be less than a horizontal area of each of the second semiconductor chips 320.

According to an exemplary embodiment, the first and second semiconductor chips 310 and 320 may at least partially overlap a first TIM layer 410a in a vertical direction. The first TIM layer 410a may contact edges of the first and second semiconductor chips 310 and 320. A horizontal area of the first TIM layer 410a may be greater than a horizontal area of a third insulating filler 350.

According to an exemplary embodiment, because a size of a part of the first TIM layer 410a between the second TIM layers 421a and 422a adjacent to each other increases, thermal coupling among the first and second semiconductor chips 310 and 320 may be reduced.

Figure 3B:
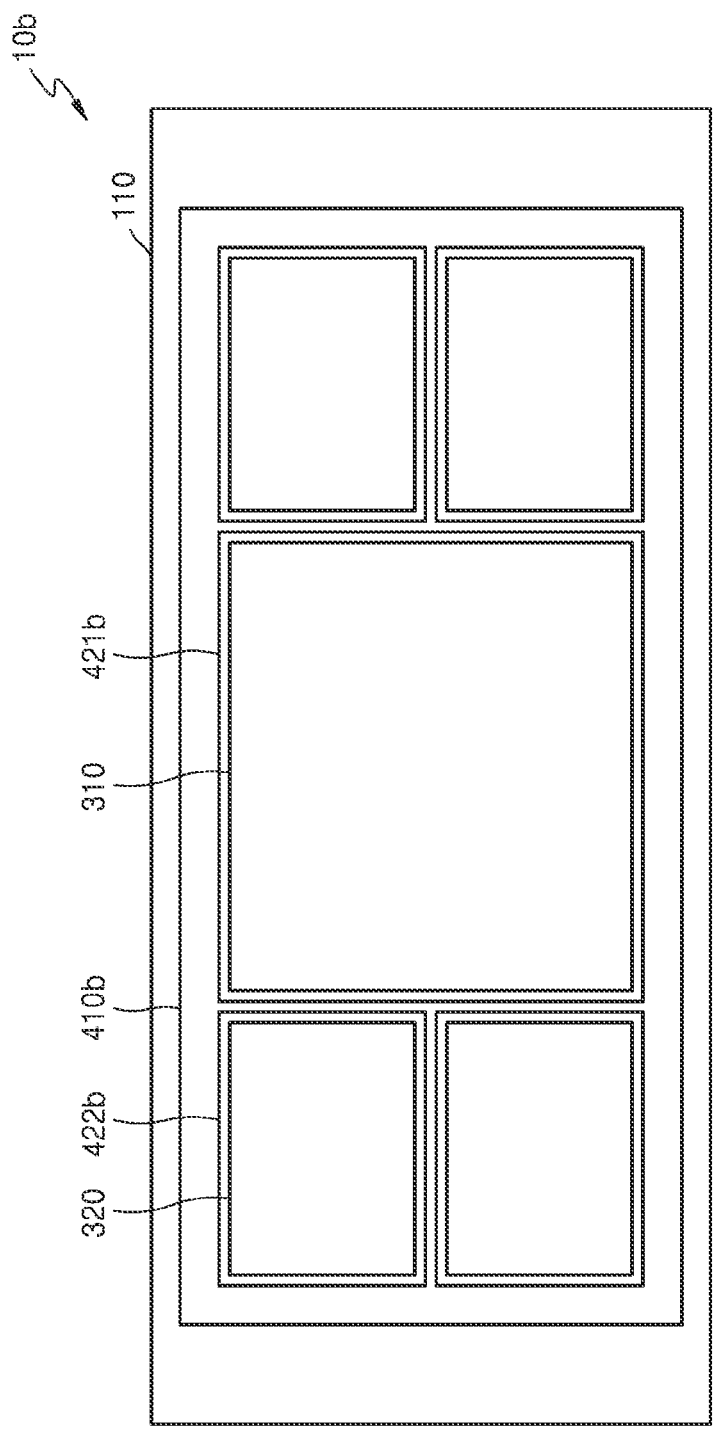

FIG. 3B is a plan view illustrating a semiconductor package 10b according to another exemplary embodiment.

Referring to FIG. 3B, the semiconductor package 10b is similar to the semiconductor package 10 described with reference to FIGS. 1A and 1B. However, a horizontal area of each of second TIM layers 421b and 422b may be different from a horizontal area of each of first and second semiconductor chips 310 and 320.

More specifically, the horizontal area of the second TIM layer 421b contacting the first semiconductor chip 310 may be greater than a horizontal area of the first semiconductor chip 310 and the horizontal area of each of the second TIM layers 422b contacting each of the second semiconductor chips 320 may be greater than a horizontal area horizontal area of each of the second semiconductor chips 320.

According to an exemplary embodiment, the second TIM layers 421b and 422b may at least partially vertically overlap a third insulating filler 350. Edges of the second TIM layers 421b and 422b may contact the third insulating filler 350. A horizontal area of a first TIM layer 410b may be less than a horizontal area of the third insulating filler 350.

According to an exemplary embodiment, because areas of the second TIM layers 421b and 422b contacting the first and second semiconductor chips 310 and 320 increase, the cooling efficiency of the first and second semiconductor chips 310 and 320 may increase.

FIG. 3C is a plan view illustrating a semiconductor package 10c according to another exemplary embodiment.

Referring to FIG. 3C, the semiconductor package 10c is similar to the semiconductor package 10 described with reference to FIGS. 1A and 1B. However, a horizontal area of each of second TIM layers 421b and 422a may be different from a horizontal area of each of first and second semiconductor chips 310 and 320.

More specifically, the horizontal area of the second TIM layer 421b contacting the first semiconductor chip 310 may be greater than a horizontal area of the first semiconductor chip 310 and the horizontal area of each of the second TIM layers 422a contacting each of the second semiconductor chips 320 may be less than a horizontal area of each of the second semiconductor chips 320.

According to an exemplary embodiment, the second TIM layer 421b may at least partially vertically overlap a third insulating filler 350. An edge of the second TIM layer 421b may contact the third insulating filler 350.

A first TIM layer 410c may at least partially vertically overlap the second semiconductor chips 320. The first TIM layer 410c may contact edges of the second semiconductor chips 320. A horizontal area of the first TIM layer 410c may be different from a horizontal area of the third insulating filler 350.

Therefore, the cooling efficiency of the first semiconductor chip 310 having a high heating value may increase and thermal coupling among the first and second semiconductor chips 310 and 320 may be reduced.

FIG. 3D is a plan view illustrating a semiconductor package 10d according to another exemplary embodiment.

Referring to FIG. 3D, the semiconductor package 10d is similar to the semiconductor package 10 described with reference to FIGS. 1A and 1B. However, a horizontal area of each of second TIM layers 421a and 422b may be different from a horizontal area of each of first and second semiconductor chips 310 and 320.

More specifically, the horizontal area of the second TIM layer 421a contacting the first semiconductor chip 310 may be less than the horizontal area of the first semiconductor chip 310 and the horizontal area of each of the second TIM layers 422b contacting each of the second semiconductor chips 320 may be greater than the horizontal area of each of the second semiconductor chips 320.

According to an exemplary embodiment, the second TIM layer 422b may at least partially vertically overlap a third insulating filler 350. Edges of the second TIM layers 422b may contact the third insulating filler 350.

A first TIM layer 410d may at least partially vertically overlap the first semiconductor chip 310. The first TIM layer 410d may contact an edge of the first semiconductor chip 310. A horizontal area of the first TIM layer 410d may be different from a horizontal area of the third insulating filler 350.

Therefore, the cooling efficiency of the second semiconductor chips 320 may increase and thermal coupling among the first and second semiconductor chips 310 and 320 may be reduced.

Figure 4:
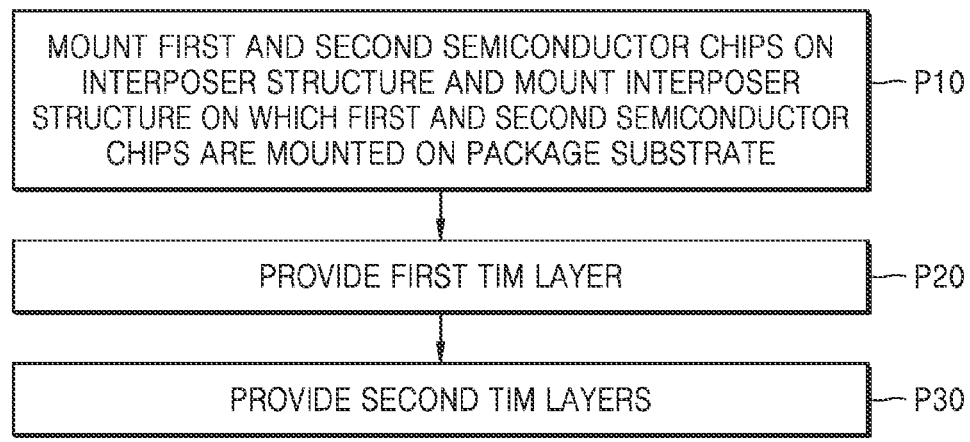
FIG. 4 is a flowchart illustrating a method of manufacturing a semiconductor package according to an exemplary embodiment.

FIG. 4 is a flowchart illustrating a method of manufacturing a semiconductor package according to an exemplary embodiment.

FIGS. 5A to 7B are views illustrating methods of manufacturing semiconductor packages according to exemplary embodiments.

Figure 5A:
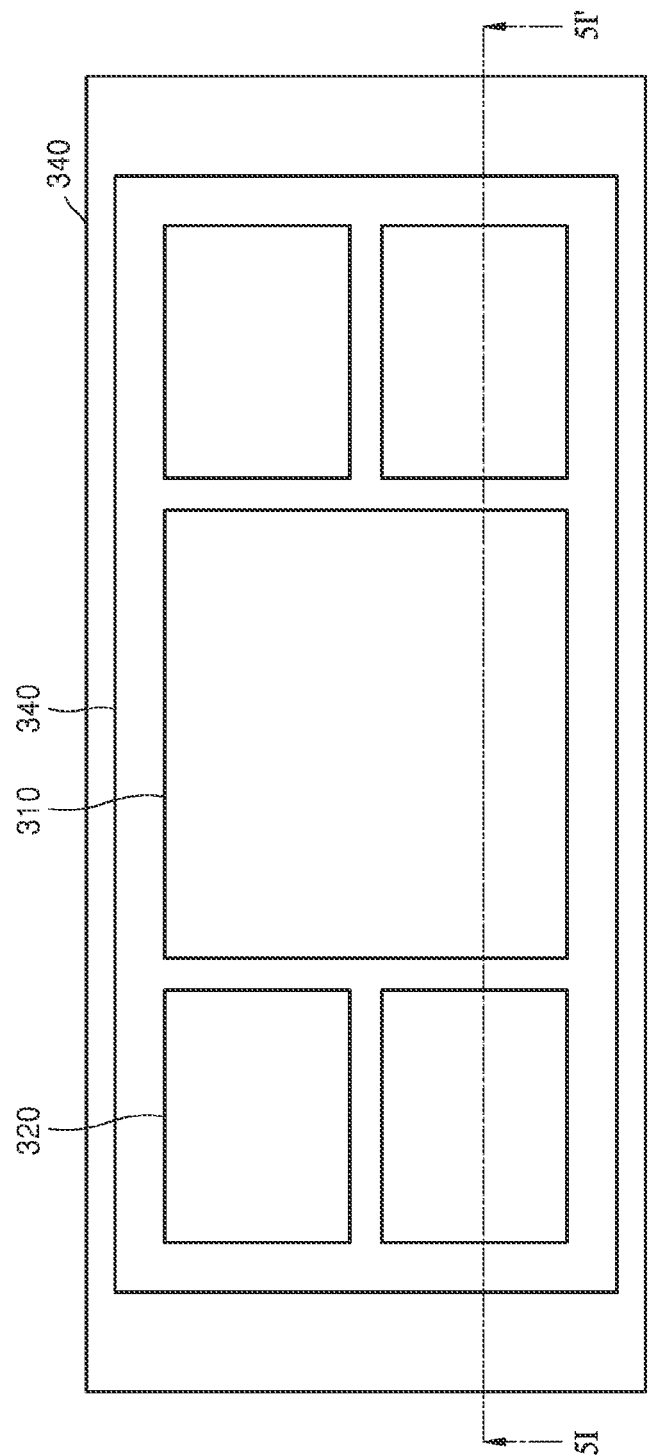
Figure 5B:
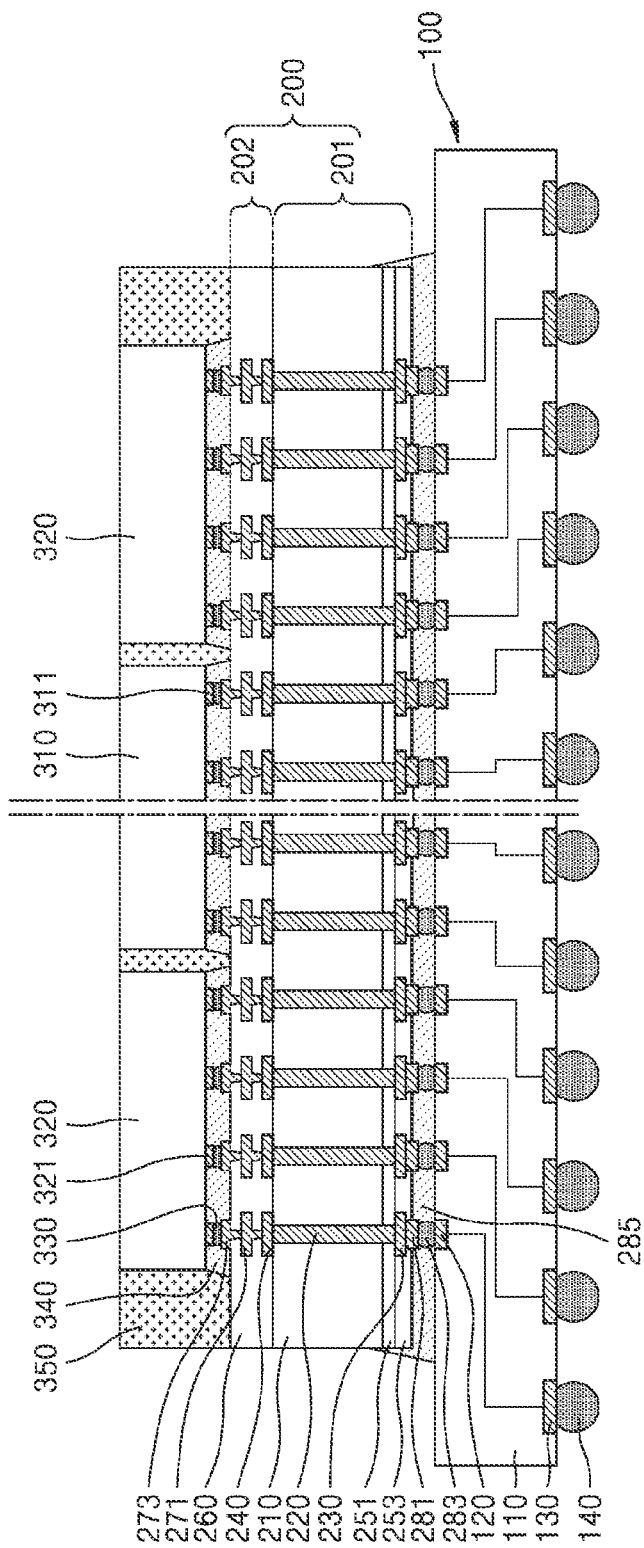
Figure 6B:
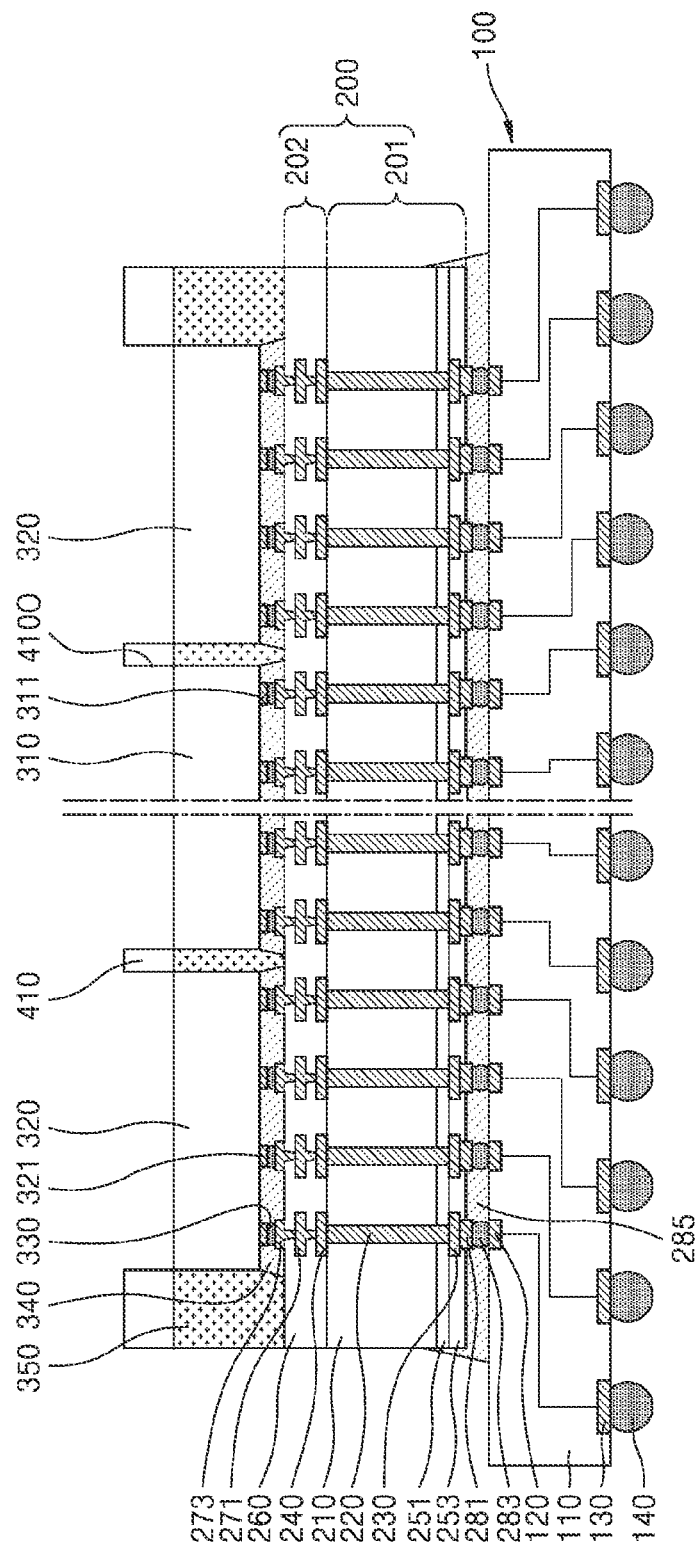
Figure 7B:
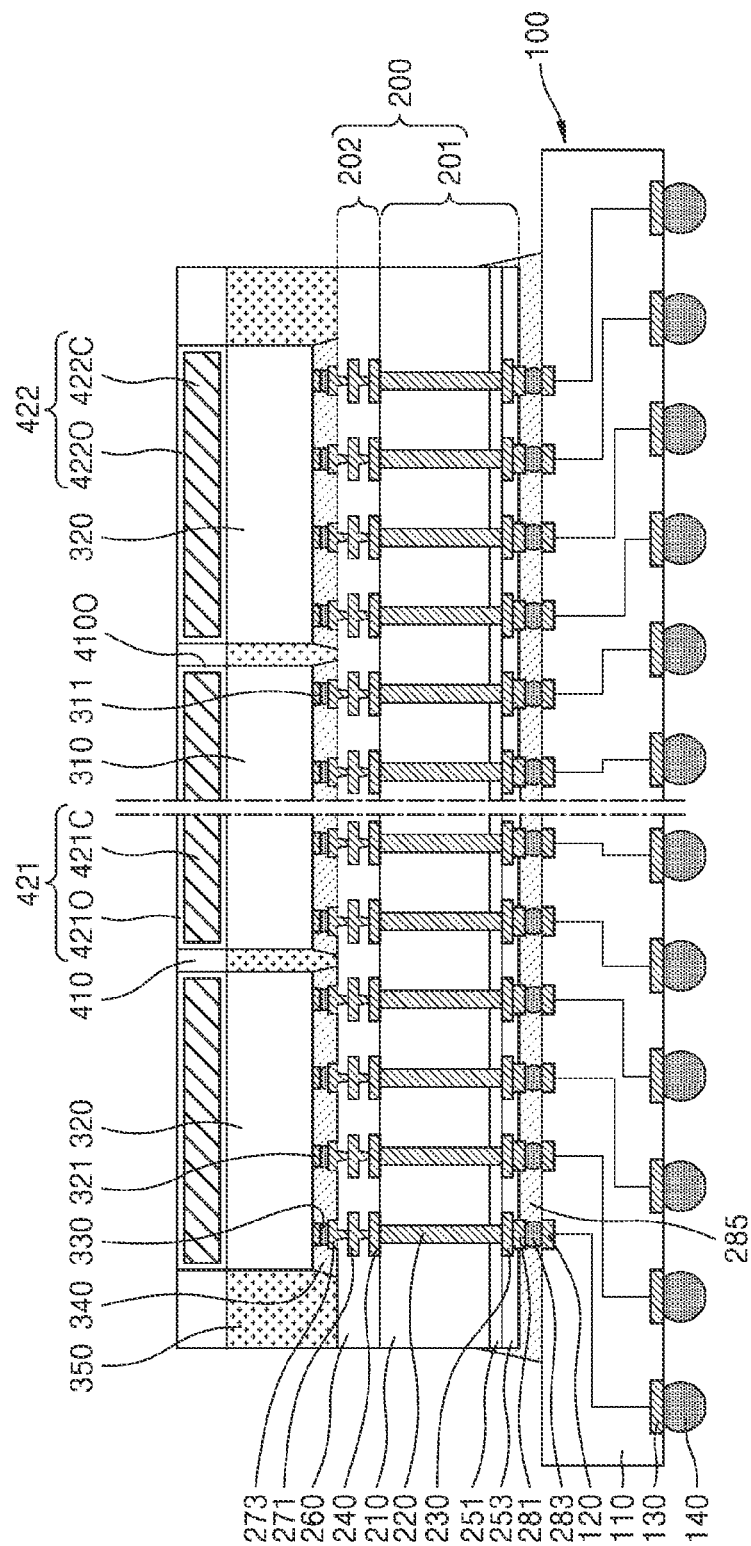

More specifically, FIGS. 5A, 6A, and 7A are plan views of results obtained by performing processes, FIG. 5B is a cross-sectional view taken along the line 5I-5I' of FIG. 5A, FIG. 6B is a cross-sectional view taken along the line 6I-6I' of FIG. 6A, and FIG. 7B is a cross-sectional view taken along the line 7I-7I' of FIG. 7A.

Referring to FIGS. 4 to 5B, in operation P10, the first and second semiconductor chips 310 and 320 may be mounted on the interposer structure 200 and the interposer structure 200 on which the first and second semiconductor chips 310 and 320 are mounted may be mounted on the package substrate 100.

The first and second semiconductor chips 310 and 320 may be mounted on the interposer structure 200 by a flip chip method. The first and second semiconductor chips 310 and 320 may be connected to the interposer structure 200 through the connection bumps 330. At this time, the first and second semiconductor chips 310 and 320 may be arranged on the interposer structure 200 at intervals in the range of about 200 μm to about 1,000 μm.

Then, the second insulating filler 340 filling a space between the first and second semiconductor chips 310 and 320 and the interposer structure 200 and partially filling a space among the side walls of the first and second semiconductor chips 310 and 320 may be formed. The second insulating filler 340 may be formed by, for example, a capillary underfill process.

Then, the third insulating filler 350 covering the sides of the first and second semiconductor chips 310 and 320 may be provided on the interposer structure 200. After providing an encapsulant such as an EMC so as to sufficiently cover the first and second semiconductor chips 310 and 320, by removing a top of the encapsulant so that the top surfaces of the first and second semiconductor chips 310 and 320 are exposed, the third insulating filler 350 may be provided. The top of the encapsulant may be removed by a chemical mechanical polishing (CMP) process and a grinding process.

The first and second semiconductor chips 310 and 320 may be mounted on the interposer structure 200 by a wafer level process. Therefore, after the first and second semiconductor chips 310 and 320 are molded, a laser sawing process may be further performed.

Then, the interposer structure 200, on which the first and second semiconductor chips 310 and 320 are mounted and which is individualized, is mounted on the package substrate 100. The interposer structure 200 may be mounted on the top surface of the package substrate 100 through the board-to-interposer connection bumps 283.

Then, the first insulating filler 285 filling the space between the interposer structure 200 and the package substrate 100 may be provided. The first insulating filler 285 may cover the board-to-interposer connection bumps 283. The first insulating filler 285 may be formed by a capillary underfill process using an underfill material.

Then, referring to FIGS. 4, 6A, and 6B, in operation P20, the first TIM layer 410 may be provided. The first TIM layer 410 may be provided by a dispensing process. The first TIM layer 410 may include the openings 410O exposing the top surfaces of the first and second semiconductor chips 310 and 320.

According to an exemplary embodiment, a horizontal area of each of the openings 410O may be equal to a horizontal area of each of the first and second semiconductor chips 310 and 320. For example, the opening 410O exposing the top surface of the first semiconductor chip 310 may have the same horizontal area as the horizontal area of the top surface of the first semiconductor chip 310. For example, each of the openings 410O exposing the top surface of each of the second semiconductor chips 320 may have the same horizontal area as the horizontal area of the top surface of each of the second semiconductor chips 320.

However, the inventive concept is not limited thereto. As illustrated in FIGS. 3 and 4, the horizontal area of each of the openings 410O may be different from the horizontal area of each of the first and second semiconductor chips 310 and 320.

For example, the opening 410O exposing the top surface of the first semiconductor chip 310 may have a horizontal area that is less than the horizontal area of the top surface of the first semiconductor chip 310 and each of the openings 410O exposing the top surface of each of the second semiconductor chips 320 may have a horizontal area that is less than the horizontal area of the top surface of each of the second semiconductor chips 320.

In another example, the opening 410O exposing the top surface of the first semiconductor chip 310 may have a horizontal area that is greater than the horizontal area of the top surface of the first semiconductor chip 310 and each of the openings 410O exposing the top surface of each of the second semiconductor chips 320 may have a horizontal area that is greater than the horizontal area of the top surface of each of the second semiconductor chips 320.

For example, the opening 410O exposing the top surface of the first semiconductor chip 310 may have a horizontal area that is greater than the horizontal area of the top surface of the first semiconductor chip 310 and each of the openings 410O exposing the top surface of each of the second semiconductor chips 320 may have a horizontal area that is less than the horizontal area of the top surface of each of the second semiconductor chips 320.

For example, the opening 410O exposing the top surface of the first semiconductor chip 310 may have a horizontal area that is less than the horizontal area of the top surface of the first semiconductor chip 310 and each of the openings 410O exposing the top surface of each of the second semiconductor chips 320 may have a horizontal area that is greater than the horizontal area of the top surface of each of the second semiconductor chips 320.

Then, referring to FIGS. 4, 6A, and 6B, in operation P30, the second TIM layers 421 and 422 may be provided. The second TIM layers 421 and 422 may fill the openings 410O of the first TIM layer 410. The oxide layers 421O and 422O of the second TIM layers 421 and 422 may be formed in a process of planarizing the second TIM layers 421 and 422.

Then, referring to FIGS. 1A and 1B, the heat dissipation device 430 may be attached onto the first and second TIM layers 410, 421, and 422. The oxide layers 421O and 422O of the second TIM layers 421 and 422 may function as adhesive layers for the heat dissipation device 430. Therefore, the stability and mechanical reliability of the semiconductor package 10 may be improved.

While the inventive concept has been particularly shown and described with reference to embodiments thereof, it will be understood that various changes and modifications in form and details may be made therein without departing from the spirit and scope of the following claims.

What is claimed is:

1. A semiconductor package comprising:
a package substrate;
an interposer structure mounted on the package substrate;
a first semiconductor chip mounted on the interposer structure;
second semiconductor chips mounted on the interposer structure and adjacent to the first semiconductor chip;
an insulating filler disposed between the first and second semiconductor chips;
a first thermal interface material (TIM) layer arranged on the insulating filler;
second TIM layers arranged on the first and second semiconductor chips; and
a heat dissipation device contacting the first and second TIM layers,
wherein a thermal conductivity of each of the second TIM layers is higher than a thermal conductivity of the first TIM layer,
wherein the first TIM layer is disposed between the second TIM layers,
wherein the first TIM layer does not vertically overlap with either the first semiconductor chip or the second semiconductor chips,
wherein at least a portion of each of the second TIM layers vertically overlaps with the insulating filler,
wherein each of the second TIM layers comprises a liquid metal,
wherein one of the second TIM layers comprises:
a core layer; and
an oxide layer surrounding the core layer to cover an upper surface, a lower surface, and a side surface of the core layer, and
wherein the first TIM layer is disposed between the second TIM layers and includes a flat side surface facing one of the second TIM layers.

2. The semiconductor package of claim 1, wherein the first TIM layer horizontally surrounds each of the second TIM layers.

3. The semiconductor package of claim 1, wherein a thickness of each of the first and second TIM layers ranges from about 50 μm to about 200 μm.

4. The semiconductor package of claim 1, wherein a thermal conductivity of each of the second TIM layers ranges from 20 W/m·K to 100 W/m·K.

5. The semiconductor package of claim 1, wherein a thermal conductivity of each of the second TIM layers ranges from 5 times to 25 times a thermal conductivity of the first TIM layer.

6. The semiconductor package of claim 1, wherein each of the second TIM layers comprises gallium indium tin (GaInSn).

7. The semiconductor package of claim 1, wherein the insulating filler covers sides of the first and second semiconductor chips and is configured to be coplanar with top surfaces of the first and second semiconductor chips.

8. The semiconductor package of claim 1, wherein the oxide layer comprises gallium oxide ($Ga_2O_3$).

9. The semiconductor package of claim 1, wherein the oxide layer attaches one semiconductor chip among the first and second semiconductor chips to the heat dissipation device.

10. The semiconductor package of claim 1, wherein
the first thermal interface material (TIM) layer includes openings at least partially exposing top surfaces of the first and second semiconductor chips, respectively, and
the second TIM layers are disposed in the openings of the first TIM layer, respectively.

11. The semiconductor package of claim 1, wherein, among the second TIM layers, a horizontal area of the second TIM layer overlapping the first semiconductor chip is equal to a horizontal area of the first semiconductor chip, and
wherein, among the second TIM layers, a horizontal area of each of the second TIM layers overlapping the second semiconductor chips is equal to the horizontal area of each of the second semiconductor chips.

12. The semiconductor package of claim 1, wherein, among the second TIM layers, a horizontal area of the second TIM layer overlapping the first semiconductor chip is less than a horizontal area of the first semiconductor chip, and
wherein, among the second TIM layers, a horizontal area of each of the second TIM layers overlapping the second semiconductor chips is less than a horizontal area of each of the second semiconductor chips.

13. The semiconductor package of claim 1, wherein, among the second TIM layers, a horizontal area of the second TIM layer overlapping the first semiconductor chip is greater than a horizontal area of the first semiconductor chip, and
wherein, among the second TIM layers, a horizontal area of each of the second TIM layers overlapping the second semiconductor chips is greater than a horizontal area of each of the second semiconductor chips.

14. The semiconductor package of claim 1, wherein, among the second TIM layers, a horizontal area of the second TIM layer overlapping the first semiconductor chip is greater than a horizontal area of the first semiconductor chip, and
wherein, among the second TIM layers, a horizontal area of each of the second TIM layers overlapping the second semiconductor chips is less than a horizontal area of each of the second semiconductor chips.

15. The semiconductor package of claim 1, wherein, among the second TIM layers, a horizontal area of the second TIM layer overlapping the first semiconductor chip is less than a horizontal area of the first semiconductor chip, and
wherein, among the second TIM layers, a horizontal area of each of the second TIM layers overlapping the second semiconductor chips is greater than a horizontal area of each of the second semiconductor chips.

16. The semiconductor package of claim 1, further comprising another insulating filler disposed between the first and second semiconductor chips and the interposer structure.

* * * * *